(12) United States Patent
Murthy et al.

(10) Patent No.: US 10,177,644 B1
(45) Date of Patent: Jan. 8, 2019

(54) INPUT CURRENT EXTRACTION FROM INDUCTOR CURRENT IN A VOLTAGE CONVERTER

(71) Applicant: TEXAS INSTRUMENTS INCORPORATED, Dallas, TX (US)

(72) Inventors: Kushal D. Murthy, Bengaluru (IN); Vikram Gakhar, Bengaluru (IN); Muthusubramanian Venkateswaran, Bengaluru (IN); Preetam Tadeparthy, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/729,004

(22) Filed: Oct. 10, 2017

(51) Int. Cl.
*H02M 3/158* (2006.01)
*H02M 1/08* (2006.01)
*G01R 29/02* (2006.01)
*G01R 19/12* (2006.01)
*H02M 1/00* (2006.01)

(52) U.S. Cl.
CPC ............. *H02M 1/08* (2013.01); *H02M 3/158* (2013.01); *G01R 19/12* (2013.01); *G01R 29/02* (2013.01); *H02M 2001/0009* (2013.01)

(58) Field of Classification Search
CPC . H02M 2001/0009; H02M 2001/0029; H02M 3/155; H02M 3/156; H02M 3/1566; H02M 3/1588
See application file for complete search history.

(56) References Cited

U.S. PATENT DOCUMENTS 8,598,860 B2 * 12/2013 Bhagwat ............. H02M 3/1588
323/284

* cited by examiner

*Primary Examiner* — Gary L Laxton
(74) *Attorney, Agent, or Firm* — Tuenlap D. Chan; Charles A. Brill; Frank D. Cimino

(57) ABSTRACT

A voltage converter includes a high side power transistor coupled to an input voltage node and a low side power transistor coupled to the high side power transistor at a switch node. The switch node is configured to be coupled to an inductor. A slope detector circuit is configured to receive a signal indicative of a current through the inductor. The inductor current is a triangular waveform comprising a ramp-up phase and a ramp-down phase. The slope detector circuit also is configured to generate an output signal encoding when the inductor current is ramping up and when the inductor current is ramping down.

19 Claims, 4 Drawing Sheets

INPUT CURRENT EXTRACTION FROM INDUCTOR CURRENT IN A VOLTAGE CONVERTER

BACKGROUND

A voltage converter generates a regulated output voltage based on an input voltage. The output voltage can be used to a power a load. A system using a voltage converter may monitor the status of the converter. One parameter to be monitored may include the input current of the converter. Monitoring the input current may be implemented through the use of an external (i.e., external to the voltage converter) sense resistor. The use of an external sense resistor, however, may require the voltage converter to provide one or more dedicated pins for the sense resistor. Further, the sense resistor requires space on a circuit board to which the voltage converter also is mounted.

SUMMARY

In one embodiment, a voltage converter includes a high side power transistor coupled to an input voltage node and a low side power transistor coupled to the high side power transistor at a switch node. The switch node is configured to be coupled to an inductor. A slope detector circuit is configured to receive a signal indicative of a current through the inductor. The inductor current is a triangular waveform comprising a ramp-up phase and a ramp-down phase. The slope detector circuit also is configured to generate an output signal encoding when the inductor current is ramping up and when the inductor current is ramping down.

In another embodiment, a voltage converter includes a high side power transistor coupled to an input voltage node and a low side power transistor coupled to the high side power transistor at a switch node. The switch node is configured to be coupled to an inductor. An inductor current sense circuit is coupled to at least one of the high or low side power transistors and is configured to generate a signal indicative of current through the inductor. The voltage converter further includes a capacitor that has a first terminal to receive the signal indicative of the inductor current, a first current source coupled to the capacitor, and a circuit configured to maintain a second terminal of the capacitor at a constant voltage level. Further, a first transistor is coupled to the second terminal of the capacitor and a first current mirror coupled to the first transistor.

In yet another embodiment, an apparatus includes a controller to generate signals to control the on and off states of high and low side power transistors coupled together at a switch node. The switch node is to be coupled to an inductor. The apparatus further includes a slope detector circuit configured to receive a signal indicative of a current through the inductor wherein the inductor current is a triangular waveform comprising a ramp-up phase and a ramp-down phase. The slope detector circuit further is configured to generate an output signal encoding when the inductor current is ramping up and when the inductor current is ramping down.

BRIEF DESCRIPTION OF THE DRAWINGS

For a detailed description of various examples, reference will now be made to the accompanying drawings in which.

DETAILED DESCRIPTION

The disclosed embodiments are directed to a buck voltage converter that produces an output voltage from an input voltage. The converter includes an inductor whose current has a triangular waveform having a ramp-up phase and a ramp-down phase. The ramp-up phase of the inductor represents the input current of the converter. The converter includes a slope detector circuit that produces a square wave that is at a first voltage level during the ramp-up phase of the inductor current (i.e., the input current) and at a second voltage level during the ramp-down phase. The slope detector circuit's square wave can be used to reproduce the input current waveform from a voltage waveform indicative of the inductor current. As such, an estimate of the input current to the converter is generated without directly measuring the input current such as by use of a sense resistor.

Figure 1:
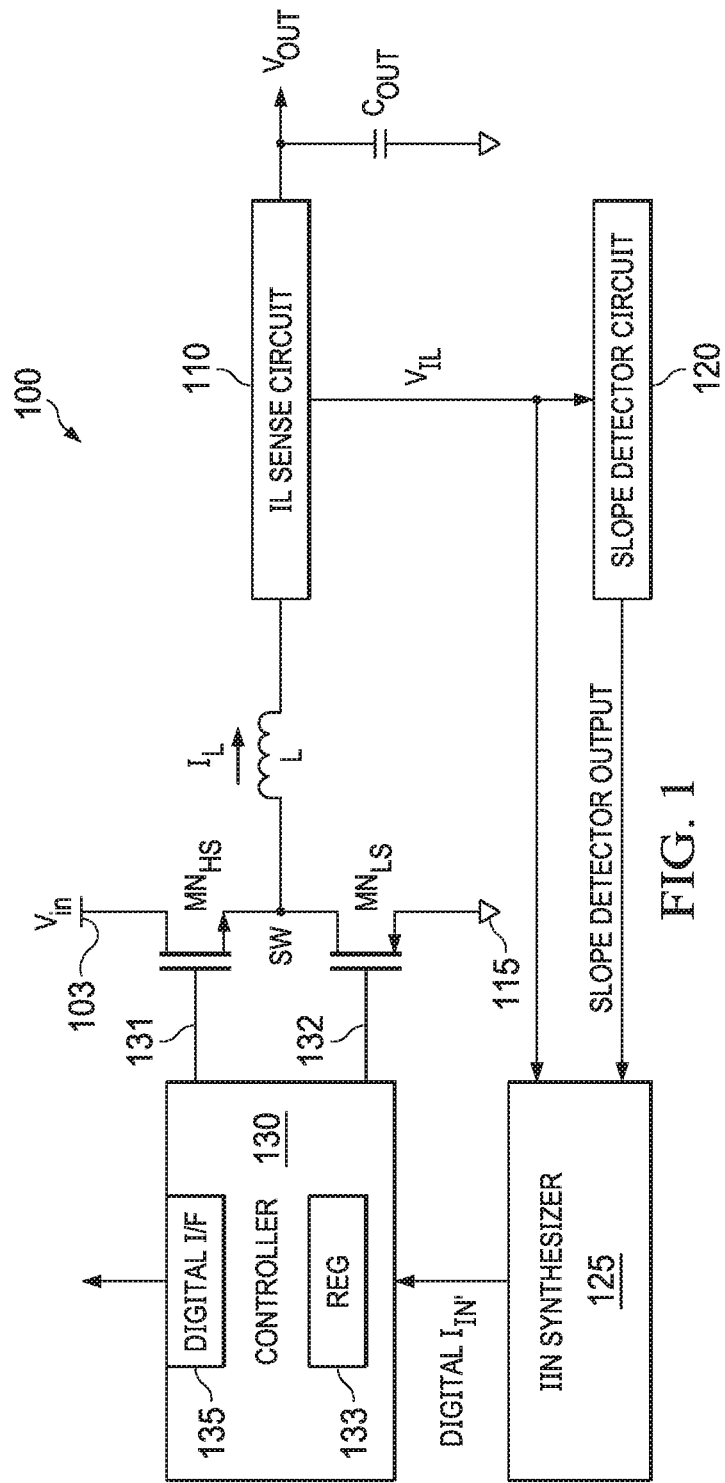
FIG. 1 illustrates a system diagram of a voltage converter including a slope detector circuit and an input current synthesizer in accordance with an embodiments.

FIG. 1 shows an example of a voltage converter 100 in accordance with an embodiment. The voltage converter 100 includes a high side power transistor $MN_{HS}$, a low side power transistor $MH_{LS}$, an inductor L, an output capacitor Cout, an $I_L$ sense circuit 110, a slope detector circuit 120, an input current (IN) synthesizer 125, and a controller 130. Any one or more of the $I_L$ sense circuit 110, slope detector circuit 120, and IN synthesizer 125 may be included within the controller 130. The illustrative voltage converter 100 of FIG. 1 is a buck converter. In this example, the high and low side power transistors are p-type metal oxide field effect transistors. The source of the high side power transistor $MN_{HS}$ is coupled to the drain of the low side power transistor $MN_{LS}$ at a switch node (SW). The inductor L is coupled to the switch node SW and to the output capacitor Cout. The voltage across the output capacitor is the output voltage (Vout) from the voltage converter. The drain of the high side power transistor $MN_{HS}$ is coupled to an input voltage node 105 which receives the input voltage Vin. The source of the low side power transistor $MN_{LS}$ is coupled to a common potential node (e.g., ground).

The controller 130 is a pulse width modulation (PWM) controller which generates control signals 131 and 132 to drive the gates of the respective power transistors $MN_{HS}$ and $MN_{LS}$. The controller 130 asserts the control signals 131 and 132 so that both power transistors are not on at the same time, and that one or the other or neither power transistor are on at any point in time. The controller 130 controls the duty cycle of the power transistors to thereby regulate the output voltage Vout to a load (not shown).

The current that flows from the input voltage node 105 and through the high side power transistor $MN_{HS}$ is the input current IN. The current $I_L$ through the inductor L is a triangle wave that has a ramp-up phase followed by ramp-down phase. The inductor current ramps up when the high side power transistor $MN_{HS}$ is on and the low side power transistor $MN_{LS}$ is off. In that state, the input current IIN flows through the high side power transistor $MN_{HS}$ and through the inductor L. Thus, with $MN_{HS}$ on and $MN_{LS}$ off, the ramp-up phase of the inductor current $I_L$ is the input current IN. However, when the high side power transistor $MN_{HS}$ is off and the low side power transistor $MN_{LS}$ is on, the input current $I_{IN}$ is zero, which means that at that point in time the ramp-down phase of the inductor current $I_L$ is not equal to the input current. The disclosed embodiments extract the ramp-up phase of the inductor current $I_L$ triangular waveform to estimate the input current.

In accordance with various embodiments, the voltage converter 100 estimates the input current IN using a voltage that is a proportional to the inductor current. In the example of FIG. 1, the $I_L$ sense circuit 110 may comprise a sense resistor (low resistance resistor) whose voltage is proportional to the current $I_L$. The voltage monitored across the sense resistor is $V_{IL}$ and is output by the $I_L$ sense circuit. Other types of current sense or proxy circuits are possible as well.

The slope detector circuit 120 receives the $V_{IL}$ signal and generates a square wave as the slope detector output signal. The edges of the slope detector output signal coincide with the transition points between ramp-up and ramp-down phases of $V_{IL}$. In one embodiment, the square wave is a logic high during the ramp-up phase of $V_{IL}$ and a logic low during the ramp-down phase of $V_{IL}$. Thus, the square wave output (the slope detector output signal) of the slope detector circuit 120 encodes when the inductor current is ramping up and when the inductor current is ramping down. The $I_{IN}$ synthesizer 125 uses the slope detector output to chop the $V_{IL}$ signal to produce a signal that is the estimate of $I_{IN}$. The $I_{IN}$ synthesizer 125 also may low pass filter and digitize the $I_{IN}$ estimate signal. The output of the $I_{IN}$ synthesizer 125 is a digitized estimate of $I_{IN}$. The digitized estimate of IN can then be stored in one or more registers 133 within the controller 130. Through a digital interface 135, an external circuit such as a central processing unit (CPU) can read the contents of the register 133. The digital interface 135 may implement any suitable protocol such the Power Management Bus (PMBus®) protocol.

Figure 2:
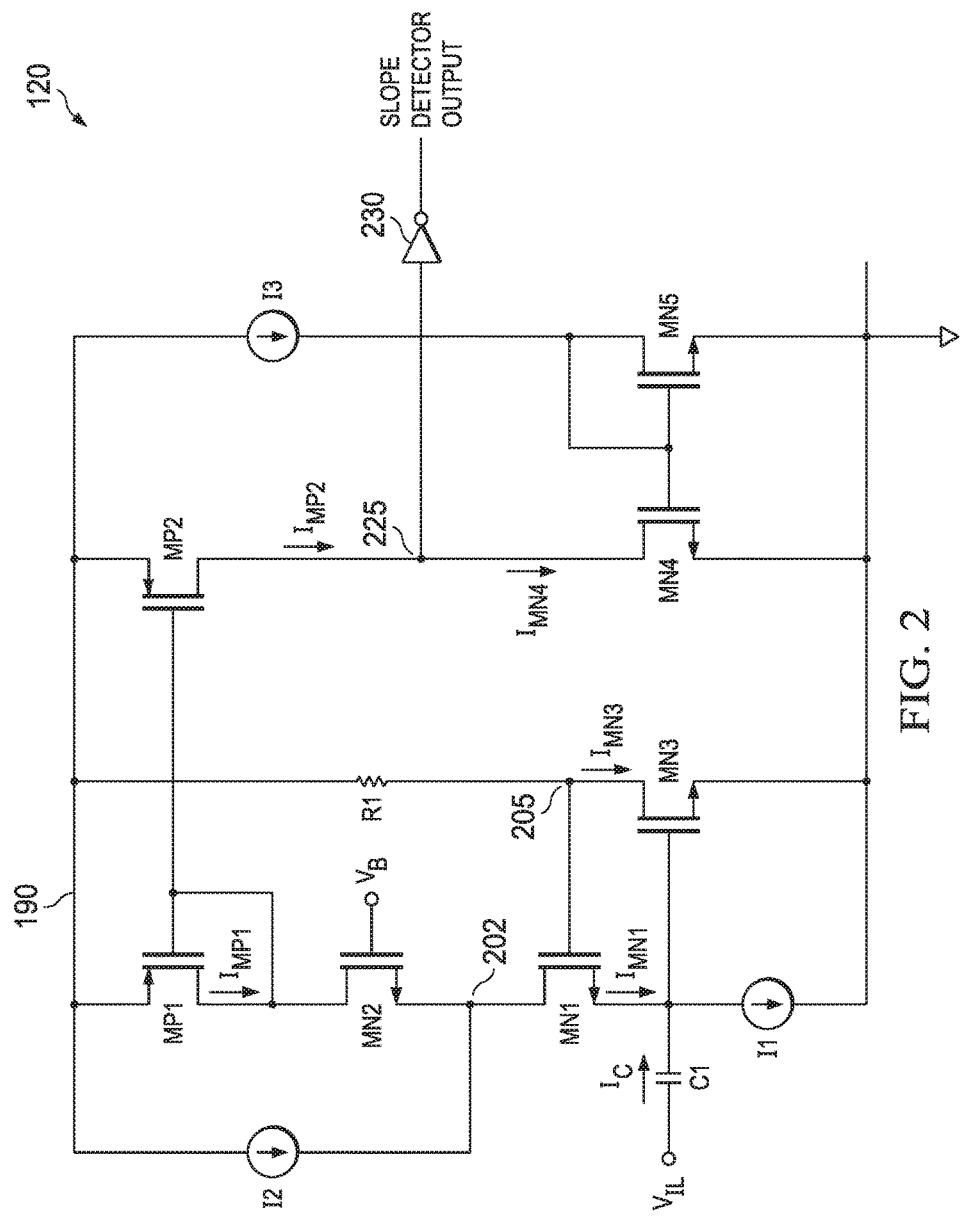
FIG. 2 illustrates an example of the slope detector circuit of FIG. 1 in accordance with an embodiment.

FIG. 2 shows an example implementation of the slope detector circuit 120. In this example, the slope detector includes a capacitor C1, a resistor R1, n-type MOSFETs MN1, MN2, MN3, MN4, and MN5, p-type MOSFETS MP1 and MP2, current sources I1, I2, and I3, and an inverter 230. The input signal $V_{IL}$ to the slope detector circuit 120 is provided to one terminal of the capacitor C1, and the inverter 230 provides the slope detector output signal. The opposing terminal of the capacitor C1 couples to a gate of MN3 thereby defining a node 200. Resistor R1 is connected to the drain of MN3. The source of MN1 couples to node 200, and thus to the capacitor C1 and to the gate of MN3. The gate of MN1 couples to resistor R1 and to the drain of MN3. Current source I1 generates a fixed current level from node 200 to ground.

MN1 is a source follower in which the voltage on the source of MN1 tracks the voltage on the gate of MN1. The combination of MN1 and MN2 forms a cascade and the drain of MN2 couples to MP2 as shown. The gate of MN2 is connected to a fixed level bias voltage VB. Current source I2 generates a fixed current level from node 190 to the node 202 between the source of MN2 and drain of MN1. The drain-to-source current flowing through MN1 is designated as $I_{MN1}$. The source-to-drain current flowing through MP1 is designated as $I_{MN2}$, and the current through the capacitor C1 is designated as $I_C$. The magnitude of $I_{MN1}$ is $I_{MN2}+I_{MP1}$. Further, $I1 = I_{MN1} + I_C$. Thus, $I_{MN1} = I_1 - I_C$.

The combination of R1 and MN3 operates to hold the voltage on node 200 at a constant voltage level. If the voltage on node 200 (and thus the gate voltage of MN3) were to start to creep upward, the drain-to-source current through MN3 ($I_{MN3}$) would increase. $I_{MN3}$ also flows through resistor R1. As a result of an increased current through R1, the voltage drop across the resistor would increase and thus the voltage on node 205 will decrease. As node 205 is connected to the gate of MN1 and because MN1 is a source follower, a decreased gate voltage for MN1 causes voltage on the source of MN1 to decrease. The source of MN1 is tied to node 200 and thus voltage on node 200 is pulled lower. The opposite response occurs if the voltage on node 200 starts to decrease. As a result, the voltage on node 200 is maintained at a relatively constant level.

The right side of capacitor C1 is tied to node 200 and thus held at a relatively constant voltage level. The left side of capacitor C1 receives the triangular wave $V_{IL}$ voltage. The current through a capacitor is C*dv/dt (i.e., the capacitance times the rate of change of the voltage across the capacitor). As the right side of the capacitor is held at a constant voltage level and the left side is linearly ramping up and down due to the $V_{IL}$ waveform, the waveform of the current through C1 is a square wave—$I_C$ is at a positive level when $V_{IL}$ is linearly ramping up and $I_C$ is at a negative level when $V_{IL}$ is linearly ramping down.

Because $I_{MN1} = I1 - I_C$, any increase in $I_C$ is offset by an equal and opposite change in $I_{MN1}$ so that I1 remains the same. As noted above, when the current through the inductor L (and thus $V_{IL}$) increases, $I_C$ is positive and when the inductor current decreases $I_C$ is negative. This means that when the inductor current is increasing, $I_{MN1}$ is lower than when the inductor current is decreasing.

The embodiment of FIG. 2 includes current source I2, although other embodiments may omit current source I2. If current source I2 were not present, $I_{MN1}$ would be the same as $I_{MP1}$. As $I_{MN1}$ current changes in response to the inductor current slop, $I_{MP1}$ changes correspondingly. As such, $I_{MP1}$ is a square wave current ($-I_C$) riding on a DC current I1. To increase the contrast between the two different states (inductor current ramp up and inductor current ramp down), I2 is subtracted from $I_{MN1}$ to determine $I_{MP1}$, that is, $I_{MP1} = I_{MN1} - I2$.

The combination of MP1 and MP2 form a current mirror and the source-to-drain current $I_{MP2}$ through MP2 equals $I_{MP1}$. MN4 and MN5 also are configured as a current mirror. The node 225 between MP2 and MN4 represents the input to the inverter 230. The current through MP1 and MP2 changes as the inductor current ramps up or down. The current through MN4 is constant. When the current through MP2 ($I_{MP2}$) is higher than $I_{MN4}$ (which will happen when the inductor current is ramping down), the input to the inverter 230 will be high, and thus the inverter's output will be low. Conversely, when $I_{MP2}$ is lower than $I_{MN4}$ (which will happen when the inductor current is ramping up), the input of the inverter will be low, and the inverter's output will be high. Current sources I1, I2, and I3 are selected such that $I_{MP2}$ changes from being higher than $I_{MN4}$ to being lower than $I_{MN4}$. That is, $I_{MN4}$ represents a current threshold for operation of the inverter 230.

Figure 3:
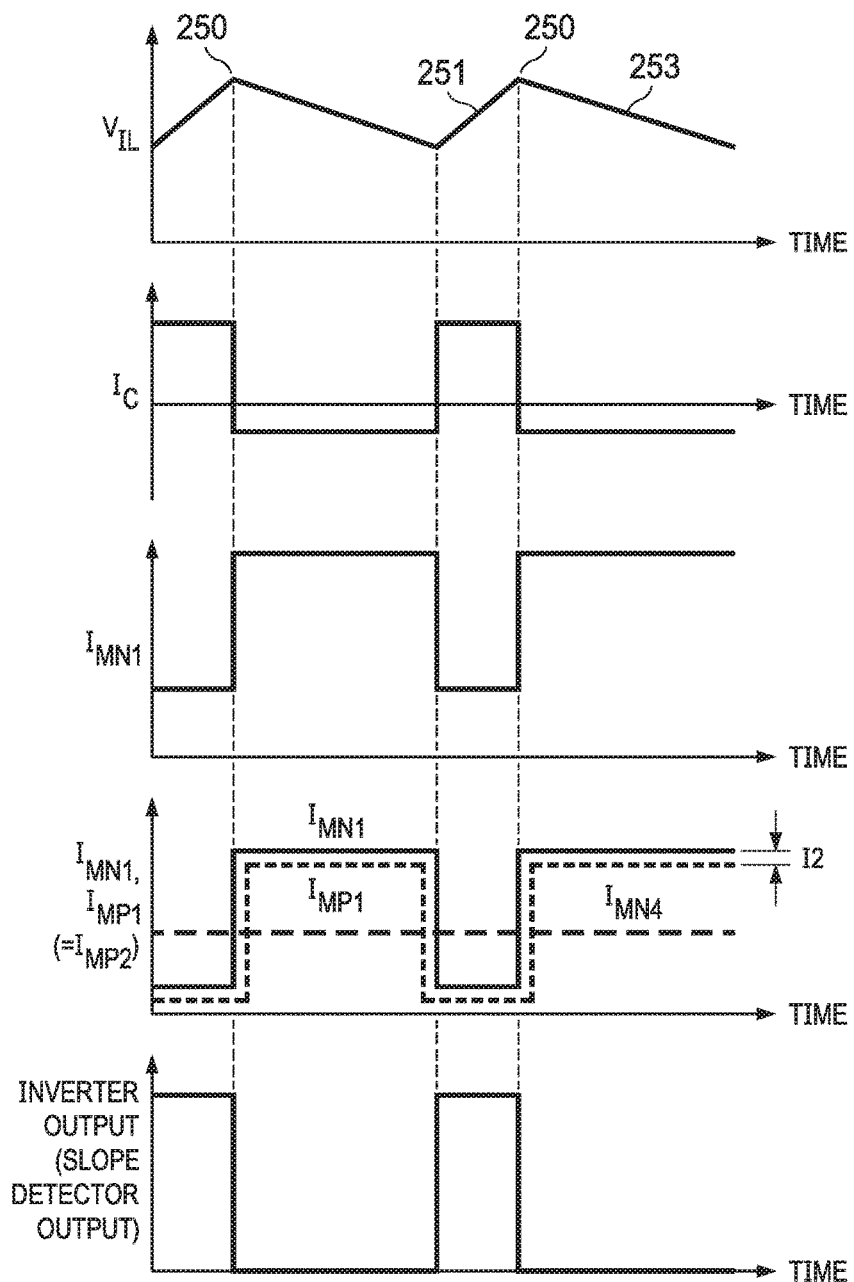
FIG. 3 shows various waveforms of signals with the voltage converter in accordance with an embodiment.

FIG. 3 shows several of the waveforms discussed above including $V_{IL}$, $I_C$, $I_{MN1}$, $I_{MP1}$, and the inverter's output (i.e., the slope detector output signal). As can be seen, the rising and falling edges of $I_C$ coincide with the transition points 250 in the $V_{IL}$ waveform between the ramp-up and ramp-down phases 251 and 253, respectively. $I_{MN1}$ (and, as explained above, $I_{MP1}$ and $I_{MP2}$) are square waves like $I_C$, but are out of phase with respect to $I_C$. $I_{MP1}$ and $I_{MP2}$ are level-shifted from $I_{MN1}$ by an amount equal to I2. The inverter's output (which is the slope detector output signal) is forced to a logic high when $I_{MP2}$ is below $I_{MN4}$, which occurs when $V_{IL}$ (and thus the inductor current) is ramping up; otherwise, the inverter's output is a logic low.

Figure 4:
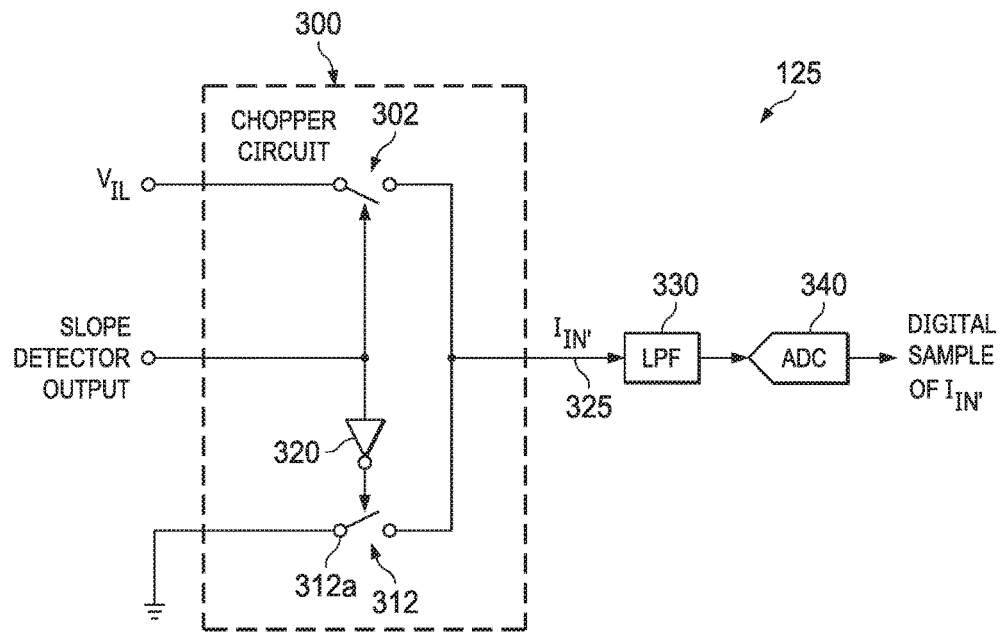
FIG. 4 shows an example of the input current synthesizer of FIG. 1 in accordance with an embodiment.

FIG. 4 provides an example of the $I_{IN}$ synthesizer 125, which generates a current that approximates $I_{IN}$ through the high side power transistor $MN_{HS}$. In the example of FIG. 4, the $I_{IN}$ synthesizer 125 includes a chopper circuit 300, a low pass filter 330, and analog-to-digital converter (ADC) 340. The chopper circuit 300 includes switch 302, switch 312 and an inverter 320. The slope detector output functions as a control signal to open and close the switches 302, 304 (i.e., turn the switches on and off). In one example, the switches are implemented as n-type MOSFETs but can be other types of transistors in other examples. The inverter 320 inverts the logic state of the slope detector output signal to thereby cause switch 312 to be off when switch 302 is on, and vice versa. The $V_{IL}$ signal is provided to switch 302. Switches 302 and 304 are connected together at node 325. As a result of the operation of switches 302 and 312 (explained below), the voltage on node 325 is a voltage that corresponds to the input voltage $I_{IN}$, and as such as referred to as $I_{IN'}$ (although it is actually a voltage).

Figure 5:
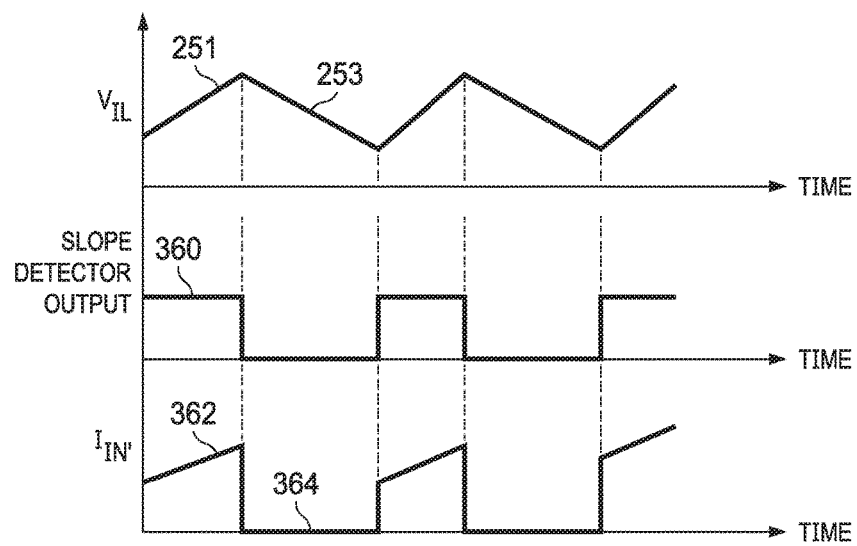
FIG. 5 shows various waveforms of signals with the voltage converter in accordance with an embodiment.

FIG. 5 shows additional waveforms described above and is referenced with respect to FIG. 4. The slope detector output being high (e.g., at 360) corresponds to the ramp-up phase 251 of $V_{IL}$ and thus the ramp-up phase of the inductor current. The slope detector output being high causes switch 302 to turn on and switch 312 to turn off. As a result, the voltage on node 325 tracks the $V_{IL}$ voltage as illustrated at 362. When the slope detector output transitions to a logic low state (which coincides with the ramp-down phase 253 of $V_{IL}$ and of the inductor current), switch 302 is forced off and switch 312 is forced on. As a result of this state of switches 302 and 312, the voltage on node 325 is pulled low due to terminal 312a of switch 312 being tied to ground. Node 325 being pulled low is illustrated at 364 in FIG. 5. Moreover, the voltage on node 325 has a waveform that matches the waveform of IN and thus represents an estimate of IN.

The IIN' signal is filtered by low pass filter 330 and then digitized by ADC 340 to generate digital samples of $I_{IN'}$. Each such sample can then be stored in register 133 within controller 130, and then read from the register via the digital interface 135.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A voltage converter, comprising:
   a high side power transistor coupled to an input voltage node;
   a low side power transistor coupled to the high side power transistor at a switch node, the switch node configured to be coupled to an inductor; and
   a slope detector circuit including:
      a capacitor having a first terminal configured to receive a signal indicative of an inductor current, and a second terminal;
      a first transistor comprising a gate coupled to the second terminal of the capacitor;
      a resistor coupled to a drain of the first transistor; and
      a second transistor comprising a source coupled to the second terminal of the capacitor and the gate of the first transistor, and a gate coupled to the resistor and the drain of the first transistor.

2. The voltage converter of claim 1, wherein:
   the slope detector circuit is configured to:
      receive a signal indicative of a current through the inductor, the inductor current being a triangular waveform comprising a ramp-up phase and a ramp-down phase; and
      generate an output signal encoding when the inductor current is ramping up and when the inductor current is ramping down; and
   the second transistor is configured to conduct a current having a first current level during the ramp-up phase and at a second current level during the ramp-down phase.

3. The voltage converter of claim 2, further comprising:
   a current mirror coupled to the second transistor and configured to mirror a current proportional to the current through the second transistor to thereby generate a mirror current;
   an inverter having an input coupled to the current mirror; and
   a third transistor coupled to the input of the inverter;
   wherein the input to the inverter is a logic high when the mirrored current is larger than a current through the third transistor, and wherein the input to the inverter is a logic low when the mirrored current is smaller than the current through the third transistor.

4. The voltage converter of claim 2, further comprising a current source coupled to the second transistor.

5. The voltage converter of claim 2, further comprising a current source coupled to the second terminal of the capacitor and the source of the second transistor.

6. The voltage converter of claim 1, wherein the slope detector circuit comprises:
   a first current source coupled to the capacitor;
   a circuit configured to maintain a second terminal of the capacitor at a constant voltage level;
   a first current mirror coupled to the first transistor;
   a second current source coupled to the first transistor;
   a third current source; and
   a second current mirror coupled to the third current source and the first current mirror.

7. The voltage converter of claim 6, further comprising an inverter coupled to the first and second current mirrors.

8. The voltage converter of claim 1, further comprising an inductor current sense circuit coupled to at least one of the high or low side power transistors and to the slope detector circuit, wherein the inductor current sense circuit is configured to generate the signal indicative of the current through the inductor.

9. The voltage converter of claim 1, further comprising a synthesizer circuit to receive the signal indicative of the current through the inductor and to receive the output signal encoding when the inductor current is ramping up and when the inductor current is ramping down, wherein the synthesizer circuit is configured to generate a voltage that has a waveform that matches a waveform of the current through the inductor.

10. The voltage converter of claim 9, wherein the synthesizer circuit comprises:
a first transistor switch which includes first and second terminals, the first terminal to receive the signal indicative of the current through the inductor; and
a second transistor switch which includes third and fourth terminals, the third terminal connected to a ground potential;
wherein the second and fourth terminals are connected together at a connection node; and
wherein the output signal encoding when the inductor current is ramping up and down controls on and off states of the first and second transistor switches.

11. A voltage converter, comprising:
a high side power transistor coupled to an input voltage node;
a low side power transistor coupled to the high side power transistor at a switch node, the switch node configured to be coupled to an inductor;
an inductor current sense circuit coupled to at least one of the high or low side power transistors and configured to generate a signal indicative of current through the inductor;
a capacitor having a first terminal to receive the signal indicative of the inductor current;
a first current source coupled to the capacitor;
a circuit configured to maintain a second terminal of the capacitor at a constant voltage level;
a first transistor coupled to the second terminal of the capacitor; and
a first current mirror coupled to the first transistor.

12. The voltage converter of claim 11, further comprising:
a second current source; and
a second current mirror coupled to the second current source and the first current mirror.

13. The voltage converter of claim 11, further comprising an inverter coupled to the first current mirror.

14. The voltage converter of claim 11, further comprising a synthesizer circuit to receive the signal indicative of the current through the inductor and to receive a signal encoding when the inductor current is ramping up and when the inductor current is ramping down, wherein the synthesizer circuit is configured to generate a voltage that has a waveform that matches a waveform of the current through the inductor.

15. The voltage converter of claim 14, wherein the synthesizer circuit comprises:
a first transistor switch which includes first and second terminals, the first terminal to receive the signal indicative of the current through the inductor; and
a second transistor switch which includes third and fourth terminals, the third terminal connected to a ground potential;
wherein the second and fourth terminals are connected together at a connection node; and
wherein the output signal encoding when the inductor current is ramping up and down controls on and off states of the first and second transistor switches.

16. The voltage converter of claim 11, wherein the inductor current sense circuit comprises a resistor connected in series with a second transistor, wherein a gate of the second transistor is connected to the second terminal of the capacitor and node between the resistor and the second transistor is connected to a gate of the first transistor.

17. An apparatus, comprising:
a controller to generate signals to control on and off states of high and low side power transistors coupled at a switch node, the switch node to be coupled to an inductor; and
a slope detector circuit including:
a capacitor having a first terminal configured to receive a signal indicative of an inductor current;
a first current source coupled to the capacitor;
a circuit configured to maintain a second terminal of the capacitor at a constant voltage level;
a first transistor having a gate coupled to the second terminal of the capacitor;
a first current mirror coupled to the first transistor;
a second current source coupled to the first transistor;
a third current source; and
a second current mirror coupled to the third current source and the first current mirror.

18. The apparatus of claim 17, wherein the slope detector circuit comprises:
a resistor coupled to a drain of the first transistor; and
a second transistor comprising a source coupled to the second terminal of the capacitor and to the gate of the first transistor, and a gate coupled to the resistor and the drain of the first transistor.

19. The apparatus of claim 18, further comprising:
an inverter having an input coupled to the first and second current mirrors; and
a third transistor coupled to the input of inverter.

* * * * *